(12) United States Patent
Kent et al.

(10) Patent No.: US 10,691,269 B2
(45) Date of Patent: *Jun. 23, 2020

(54) MECHANICAL DEFLECTION COMPENSATION FOR A CAPACITIVE TOUCH INPUT DEVICE

(71) Applicant: Elo Touch Solutions, Inc., Milpitas, CA (US)

(72) Inventors: Joel C. Kent, Fremont, CA (US); Selina Li, Sunnyvale, CA (US)

(73) Assignee: Elo Touch Solutions, Inc., Milpitas, CA (US)

( * ) Notice: Subject to any disclaimer, the term of this patent is extended or adjusted under 35 U.S.C. 154(b) by 69 days.

This patent is subject to a terminal disclaimer.

(21) Appl. No.: 15/976,336

(22) Filed: May 10, 2018

(65) Prior Publication Data

US 2018/0260054 A1    Sep. 13, 2018

Related U.S. Application Data

(63) Continuation of application No. 13/013,596, filed on Jan. 25, 2011, now Pat. No. 10,001,883.

(Continued)

(51) Int. Cl.
*G06F 3/044* (2006.01)
*G06F 3/0354* (2013.01)
(Continued)

(52) U.S. Cl.
CPC .......... *G06F 3/044* (2013.01); *G06F 3/03547* (2013.01); *G06F 3/0418* (2013.01);
(Continued)

(58) Field of Classification Search
CPC .... G06F 3/03547; G06F 3/0418; G06F 3/044; H03K 17/9622; H03K 2217/960755
(Continued)

(56) References Cited

U.S. PATENT DOCUMENTS 5,327,164 A    7/1994 Fagard et al.
5,861,583 A    1/1999 Schediwy et al.
(Continued)

FOREIGN PATENT DOCUMENTS

CN    101847068 A    9/2010
WO    WO 96/15464    5/1996

OTHER PUBLICATIONS

International Search Report & Written Opinion for PCT/US2011/066032 (PCT counterpart application of ET-01074-US1) dated Mar. 6, 2012.

(Continued)

*Primary Examiner* — Kwin Xie
(74) *Attorney, Agent, or Firm* — Sterne, Kessler, Goldstein & Fox P.L.L.C.

(57) ABSTRACT

A location of contact with a touch sensitive device is determined. Output signals associated with a plurality of electrodes such as formed on a single layer of the touch sensitive device are measured to identify a first electrode positioned at an approximate location of contact with the touch sensor. An output signal associated with a different electrode that is separated from the first electrode is measured to determine an undesired signal amount, such as due to deflection. An undesired single amount associated with the first electrode may be estimated based on the undesired signal amount measured at the other electrode. The signal amount measured at the first electrode is then compensated by the estimated undesired signal amount. The location of contact with the touch sensor is then determined based on the compensated signal amount.

20 Claims, 8 Drawing Sheets

Related U.S. Application Data

(60) Provisional application No. 61/426,421, filed on Dec. 22, 2010, provisional application No. 61/426,344, filed on Dec. 22, 2010.

(51) Int. Cl.
 *G06F 3/041* (2006.01)
 *H03K 17/96* (2006.01)

(52) U.S. Cl.
 CPC ............... *H03K 17/9622* (2013.01); *H03K 2217/960755* (2013.01)

(58) Field of Classification Search
 USPC .................................................. 345/173–174
 See application file for complete search history.

(56) References Cited

U.S. PATENT DOCUMENTS

| | | | |
|---|---|---|---|
| 5,877,458 A | | 3/1999 | Flowers |
| 6,297,811 B1* | | 10/2001 | Kent ..................... G06F 3/044 178/18.01 |
| 7,567,240 B2 | | 7/2009 | Peterson, Jr. et al. |
| 8,314,779 B2 | | 11/2012 | Chan et al. |
| 9,152,278 B2 | | 10/2015 | Kent et al. |
| 10,001,883 B2* | | 6/2018 | Kent ................... G06F 3/03547 |
| 2004/0104826 A1 | | 6/2004 | Philipp |
| 2006/0267953 A1 | | 11/2006 | Peterson et al. |
| 2006/0279548 A1 | | 12/2006 | Geaghan |
| 2007/0052690 A1 | | 3/2007 | Roberts |
| 2008/0041642 A1 | | 2/2008 | Trent et al. |
| 2008/0158169 A1 | | 7/2008 | O'Connor et al. |
| 2009/0095540 A1 | | 4/2009 | Zachat et al. |
| 2009/0127003 A1 | | 5/2009 | Geaghan |
| 2010/0060609 A1 | | 3/2010 | Doi et al. |
| 2010/0214232 A1* | | 8/2010 | Chan ....................... G06F 3/044 345/173 |
| 2010/0253647 A1* | | 10/2010 | Agari ................... G06F 3/0416 345/174 |
| 2010/0253651 A1* | | 10/2010 | Day ........................ G06F 3/044 345/175 |
| 2010/0295813 A1 | | 11/2010 | Kent |
| 2010/0295814 A1 | | 11/2010 | Kent et al. |
| 2011/0001706 A1* | | 1/2011 | Sanford ................ G06F 3/0412 345/173 |
| 2011/0050586 A1* | | 3/2011 | Miller .................. G06F 3/0412 345/173 |
| 2011/0210941 A1 | | 9/2011 | Reynolds et al. |
| 2011/0241907 A1 | | 10/2011 | Cordeiro |
| 2011/0279169 A1 | | 11/2011 | Salaverry |
| 2011/0279409 A1 | | 11/2011 | Salaverry et al. |
| 2012/0098783 A1 | | 4/2012 | Badaye et al. |
| 2012/0162123 A1 | | 6/2012 | Kent et al. |

OTHER PUBLICATIONS

Office Action for U.S. Appl. No. 13/013,613, dated Nov. 8, 2012.
Office Action for U.S. Appl. No. 13/013,613 dated Aug. 23, 2013.
International Search Report and Written Opinion from International Application No. PCT/US2011/066026, dated Mar. 14, 2012.
International Preliminary Report on Patentability from International Application No. PCT/US2011/066026, dated Jun. 25, 2013.
Final Office Action from U.S. Appl. No. 13/013,613, dated Apr. 10, 2013.
Final Office Action from U.S. Appl. No. 13/013,613, dated Feb. 26, 2014.

* cited by examiner

MECHANICAL DEFLECTION COMPENSATION FOR A CAPACITIVE TOUCH INPUT DEVICE

CROSS-REFERENCE TO RELATED APPLICATIONS

This application is a continuation of U.S. patent application Ser. No. 13/013,596 filed on Jan. 25, 2011, which claims the benefit of U.S. Provisional Patent Application Nos. 61/426,421 and 61/426,344 each filed on Dec. 22, 2010, the disclosures of which are incorporated by reference herein in their entireties.

BACKGROUND

Capacitive touch input devices are utilized in a variety of applications. For example, transparent capacitive touch input devices placed in front of displays may be utilized with computers or portable devices to enable user interaction with displayed objects. Opaque capacitive touch input devices are used for track pads and other applications not requiring programmable displayed images behind the touch surface.

Capacitive touch input devices may include a touch sensitive electrode layer that enables determination of a point of contact such as over a display, at the location where a user touches the touch sensitive layer over the display. A group of sensing electrodes enable determining the X and Y location of the point of contact. The electrodes may be coupled to capacitance sensing circuitry including analog-to-digital converters that measure values associated with the electrodes, such as the capacitance, current, charge, impedance or voltage associated with the electrodes.

Many capacitive touch input devices use at least two electrode layers to measure two coordinates, e.g. (X,Y), of a touch location. For example, parallel sensing electrodes aligned along the X-axis formed on a first layer and parallel sensing electrodes aligned along the Y-axis formed on a different or second layer such that the electrodes on the first layer are formed orthogonally with respect to the electrodes on the second layer and form an overlapping matrix of addressable points of the touch sensor. Such two layer capacitive touch input devices provide good touch performance for many applications, but at increased manufacturing costs.

For some applications, a touch input device with a single electrode layer may provide adequate touch performance at a lower cost. However, single electrode layer touch devices tend to be more susceptible to certain sources of background interference as compared to two-electrode-layer capacitive input devices.

Stray capacitance between the sensing electrodes and the palm of the hand or other body parts of the user is one source of background interference. The ratio of undesired palm background signal to the desired finger touch signal increases as the thickness of the dielectric layer between electrodes and the touch surface increases.

Mechanical deflection of the touch device is another source of background interference. For example, touch induced pressure against the device may cause mechanical deflection between sensing electrodes and an underlying ground plane. For cost reduction reasons, it may be desirable to leave a small air gap (rather than more expensive optical bonding of potting adhesive) between the sensing electrodes and the underlying ground plane. Cost may be further reduced by eliminating extra ground or shield conductive planes between the sensing electrodes and underlying conductors. However, these cost saving measures weaken the electrode layer, making the electrode layer more susceptible to flexing when touched.

BRIEF SUMMARY

Methods, system, and computer readable media are provided for determining a location of contact with a touch sensitive device. A reference measurement determines an amount of undesired signal due to deformation or other undesired skewing. The amount of undesired signal is removed from the measurements for detecting location.

In a first aspect, the method may include measuring output signals associated with a plurality of electrodes of the touch sensitive device, the touch sensitive device comprising a single electrode layer device; and identifying a first electrode positioned at an approximate location of contact with the touch sensitive device. An output signal associated with a different electrode that is separated from the first electrode may be selected to determine an undesired signal amount. An undesired signal amount associated with the first electrode may be estimated based on the undesired signal amount measured at the other electrode. The signal amount measured at the first electrode may then be compensated by the estimated undesired signal amount. The location of contact with the touch pad may then be determined based on the compensated signal amount.

In a second aspect, a system is provided for determining a location of contact with a touch sensitive device. One or more analog-to-digital converters are configured to measure output signals associated with a plurality of electrodes. The electrodes include a first electrode and at least one other electrode that is separated from the first electrode by a distance. A processor is configured to identify a relative location of the first electrode when contact is made with the touch sensitive device approximately at the first electrode; estimate an undesired signal amount associated with the first electrode based on the undesired signal amount measured at the at least one other electrode, compensate a signal amount measured at the first electrode by the estimated undesired signal amount, and determine a location of contact based on the compensated signal amount.

In a third aspect, a non-transitory computer readable storage medium is provided. The storage medium includes instructions for determining a contact location based on capacitance measurement at a plurality of electrodes; estimating an amount of the capacitance measurements at the contact location due to mechanical deflection based on the capacitance measurements spaced away from a contact location; and accounting for the amount in the determining.

The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The accompanying drawings are included to provide a further understanding of the claims, are incorporated in, and constitute a part of this specification. The detailed description and illustrated embodiments described serve to explain the principles defined by the claims.

DETAILED DESCRIPTION OF SPECIFIC EMBODIMENTS OF THE INVENTION

The embodiments below describe systems and methods that compensate for mechanical deflection in a touch sensitive device. In particular, output signals at electrodes of the touch sensitive device that are distanced away from a point of contact are measured to determine an amount of background capacitance associated with mechanical deflection at the distanced electrodes. An amount of background capacitance at the point of contact is then interpolated based on the measured background capacitance associated with the distanced electrodes. The interpolated background capacitance is then subtracted from the capacitance measured at the point of contact and a more accurate location of contact is determined.

Figure 1A:
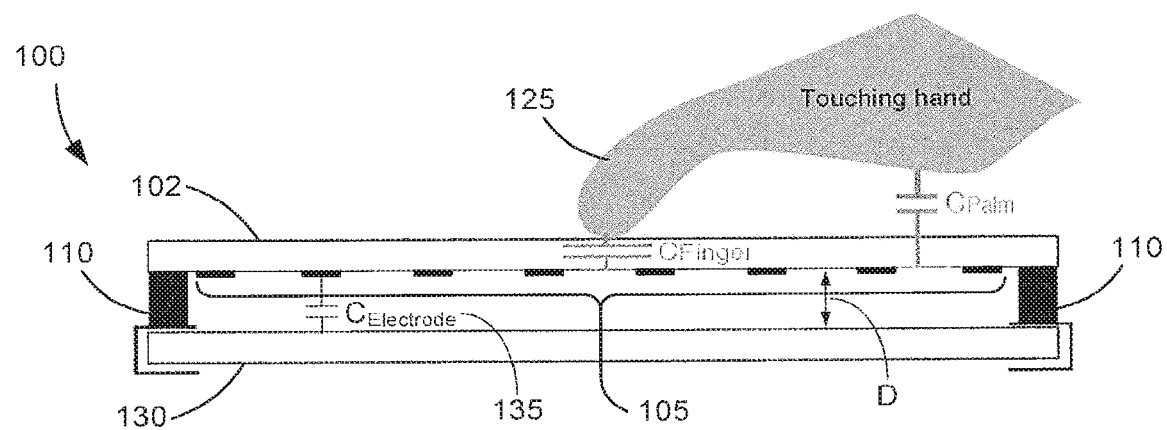
FIG. 1A illustrates an exemplary side view of a capacitive touch sensitive device.

FIG. 1A illustrates an exemplary side view of a capacitive touch sensitive device 100. The touch sensitive device 100 includes a contact layer 102 and a ground plane 130. The contact layer 102 and ground plane 130 are separated by a distance D by a support structure 110. Additional, different, or fewer components may be provided. For example, additional support structures 110 are provided.

The ground plane 130 may correspond to a conductive material. In a specific embodiment such as where device 100 is a touchscreen, a transparent conductive ground plane 130 such as indium tin oxide (ITO) may be used. In some implementations, the ground plane 130 is formed as part of a display (not shown), such as a liquid crystal display, light emitting diode (LED) display, or a different type of display. In other embodiments such as where device 100 is a touch pad, the ground plane 130 may be any opaque conductive metal layer.

The contact layer 102 may be transparent or partially transparent. The contact layer 102 is may be glass, a plastic material, or a different transparent or opaque material having at least one conductive electrode layer, as described below.

A group of electrodes 105, (e.g., 8 electrodes) for determining a contact location may be positioned on a lower surface of the contact layer 102. The number of electrodes 105 may be increased or decreased to change the resolution of the determined contact location. The electrodes 105 may correspond to a single layer of transparent conductive electrodes that extend in a Y-axis direction from one side of the contact layer 102 to an opposite side along the plane such that electrodes 105 do not overlap. In a specific embodiment, the single layer may be the only electrode layer, without other layers of sensing electrodes and/or without overlapping electrodes within the plane of the contact layer 102. However, in alternative embodiments, the electrodes 105 may be on one layer as part of a multi-layer (e.g., two-layer) electrode pattern in which an orthogonal set of electrodes is in another plane.

The electrodes 105 are deposited, bonded, or otherwise formed on the contact layer 102. The electrodes 105 may be made of a material, such as ITO, thin metallic films, carbon nanotubes, silver nanowires and intrinsically conductive polymers, which may be transparent. For opaque applications electrodes 105 may be of any conducting material including copper, other metals, and conductive composite polymers containing carbon or metal particles.

Each electrode 105 may interact with the ground plane 130 to form a capacitor 135. The value of the capacitor may be directly related (e.g., inversely proportional) to the air-gap distance D between the contact layer 102 and the ground plane 130. The electrodes 105 may be parallel to one another and may be evenly distributed across the lower surface of the contact layer 102. Other spacing, nonparallel alignment, extents and/or patterns may be used in other embodiments.

Figure 1B:
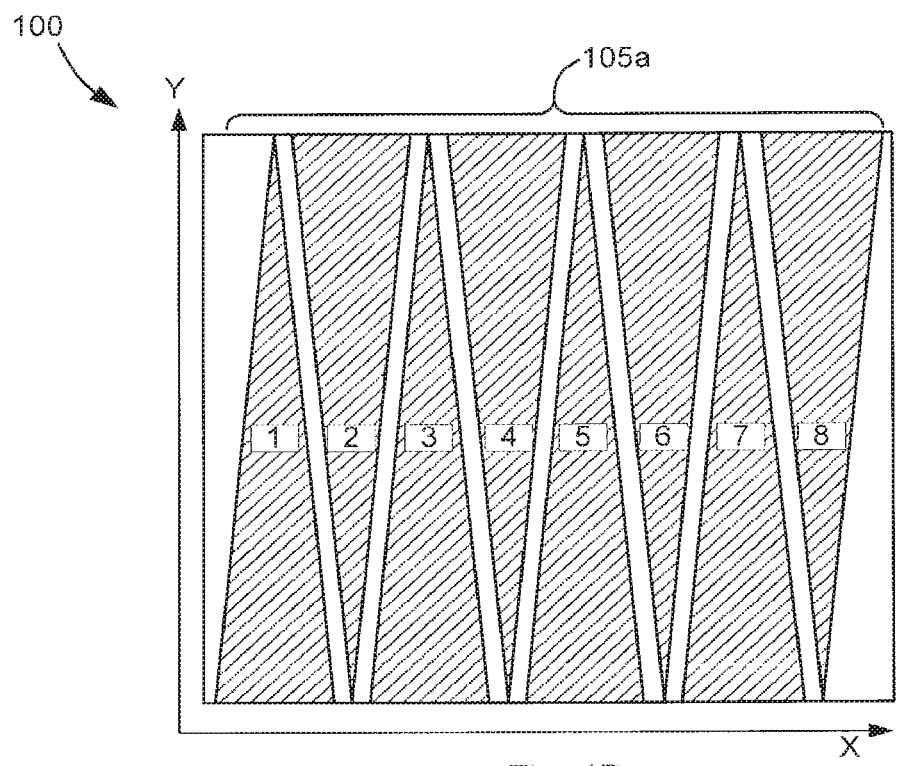
FIG. 1B illustrates a top view of a first exemplary sensing electrode pattern of the capacitive touch sensitive device.
Figure 1C:
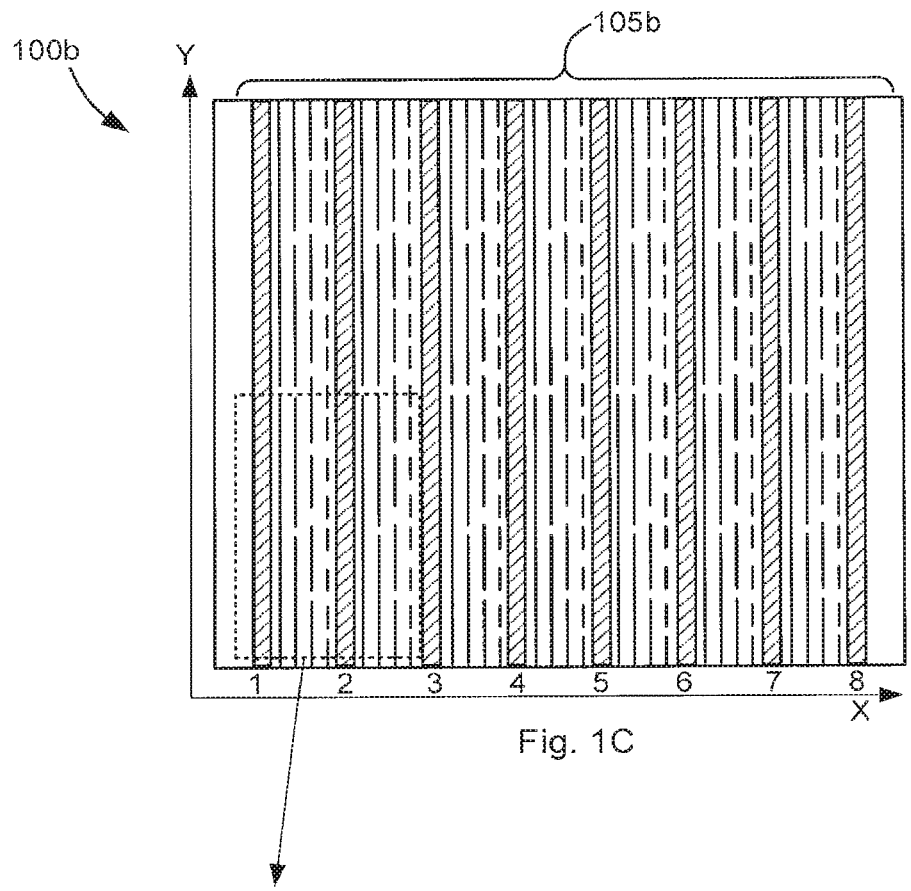
FIG. 1C illustrates a top view of a second exemplary sensing electrode pattern of the capacitive touch sensitive device.
Figure 1C:
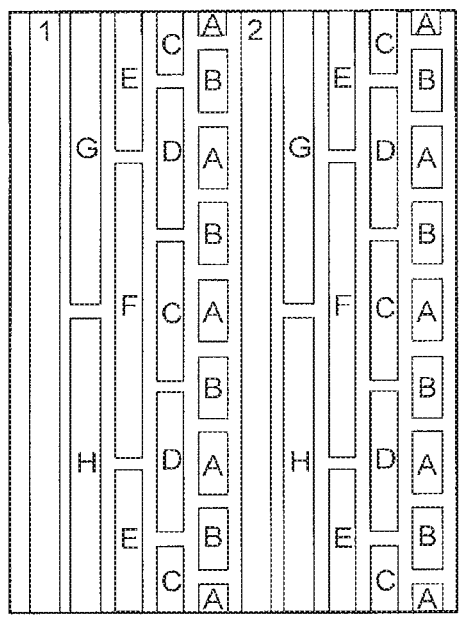

FIGS. 1B and 1C illustrate respective top views of different exemplary sensing electrode patterns that may be utilized with the capacitive touch sensitive device 100, according to specific embodiments. Referring to FIG. 1B, the electrodes 105a may be generally triangular shaped and may be arranged in an alternating configuration, such as the so-called "backgammon" electrode pattern such as disclosed in U.S. Pat. No. 6,297,811 or in U.S. published patent applications 20100295814 or 20100295813, which are hereby incorporated by reference. This type of electrode pattern provides coordinate sensing electrodes on a single layer. The vertical coordinate of a contact location may be determined by the fraction of the touch signal measured at the odd numbered triangular electrodes (e.g., 1, 3, 5, and 7) while the horizontal coordinate of the contact location is determined by the distribution of the touch signal as a function of electrode number, for example, by a mean, median or maximum of the distribution. For good touch performance, it is desirable that the triangular electrodes be sufficiently narrow and numerous so that a typical finger touch contact area overlaps several different electrodes. FIG. 1B is a conceptual illustration in which the width of the electrodes 105a is exaggerated and then number of electrodes is much smaller than more typical numbers in the 50 to 200 range. In some applications it may be desirable to limit the number of electronic channels for cost reasons, in which case systems can be designed so that more than one electrode is electrically connected to each electronic channel, for example electrodes 3, 5 and 7 could be connected to one electronic channel and electrodes 6 and 8 to the next electronic channel.

Referring to FIG. 1C, the electrodes 105b may be arranged in a so-called "binary" pattern, such as described in U.S. patent application Ser. No. 12/780,077, which is hereby incorporated by reference. This type of electrode pattern provides coordinate sensing electrodes only on a single layer. Each numbered and lettered segment corresponds to an electrode 105b. Electrodes or segments 105b with the same number or letter may be electrically connected together for an electronic channel either via small interconnect traces (not shown) within the pattern or via interconnections in associated cabling or printed circuit boards (not shown). The horizontal coordinate of the contact location is determined via those electrodes 105b that extend the full height of the touch area (electrodes 1, 2, . . . , 8). The vertical coordinate is determined via the lettered electrodes (A, B, H). The vertical coordinate may be represented by a binary code, such as a 4-bit binary code for a specific embodiment, where each bit of the code is associated with a given column of vertical coordinate electrodes 105b and the value of each bit indicates which of the two vertical coordinate electrodes in a given column has the strongest capacitance measurement signal. For example, the 0 value of the least significant bit of the pattern 0010 may indicate that the electrode measurement associated with electrode B is smaller than electrode A. The value 1 of the second lowest order bit may indicate that the electrode measurement associated with electrode D is larger than electrode C. The value of the second highest order bit of the pattern 0010 and the most significant bit may indicate the relative measurements for electrodes E and F, and for electrodes G and H, respectively. Additional bits of vertical coordinate information can be provided by having additional columns of more finely segmented electrodes.

Figure 2:
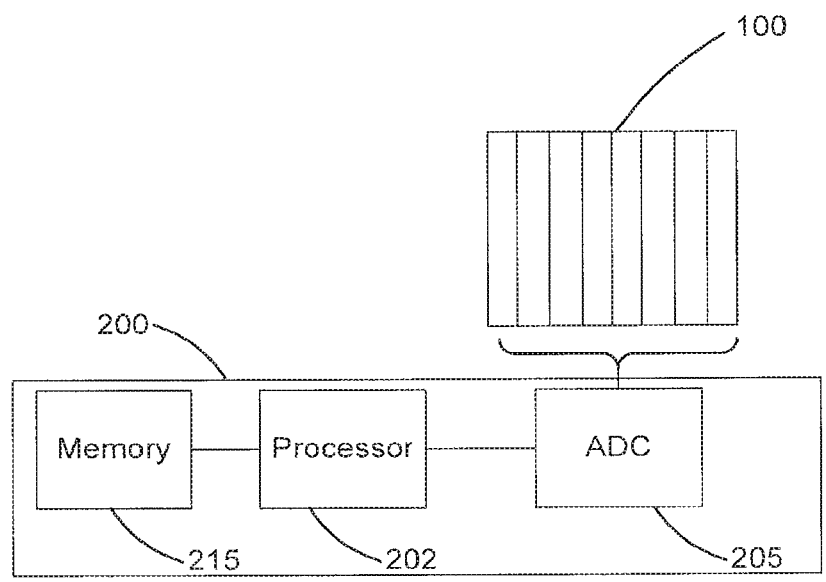
FIG. 2 illustrates an exemplary system that may be utilized to determine a contact location.

FIG. 2 illustrates an exemplary system 200 that may be utilized to determine the contact location. The system 200 includes a processor 202, a memory 215, and an analog-to-digital converter 205 (ADC). The ADC 205 and associated analog electronics may be utilized to measure capacitance values associated with the electrodes 105 and any other sensing electrodes in the capacitive input device. For example, the electrodes 105 may be coupled to the ADC 205. The ADC 205 may have a resolution of 8, 16, or 32 bits, according to specific embodiments. The resolution of the ADC 205 may be different and may be suited to a particular need. A multiplexer or other switching device allows the ADC 205 to measure separately at each electrode along the respective axis. Alternatively, one ADC measures a first group of electrodes and a different ADC is provided for measuring a different group of electrodes.

The processor 202 is in communication with the ADC 205 and is configured to analyze the capacitance values measured by the ADC 205 to determine a contact location of the contact layer 102. The processor 202 may correspond to an ARM®, Intel®, AMD®, PowerPC® processor, or a different processor. The processor 202 may include or be in communication with the memory 215. The memory 215 may be a random-access memory, read-only memory, programmable memory, or a different type of non-transitory memory. The memory 215 may store instruction code to be executed by the processor for carrying out operations including any operations described herein. The instruction code configures the processor 202 for operation by being provided in the memory prior to use and/or by being loaded into the processor 202 during operation. The memory 215 may also store various parameters utilized in determining a contact location of the contact layer 102. Other information may be stored in the memory 215. The respective components 202, 205, and 215 may all be contained in a single chip, or each could be a separate electronic component, or a combination thereof.

Figure 3:
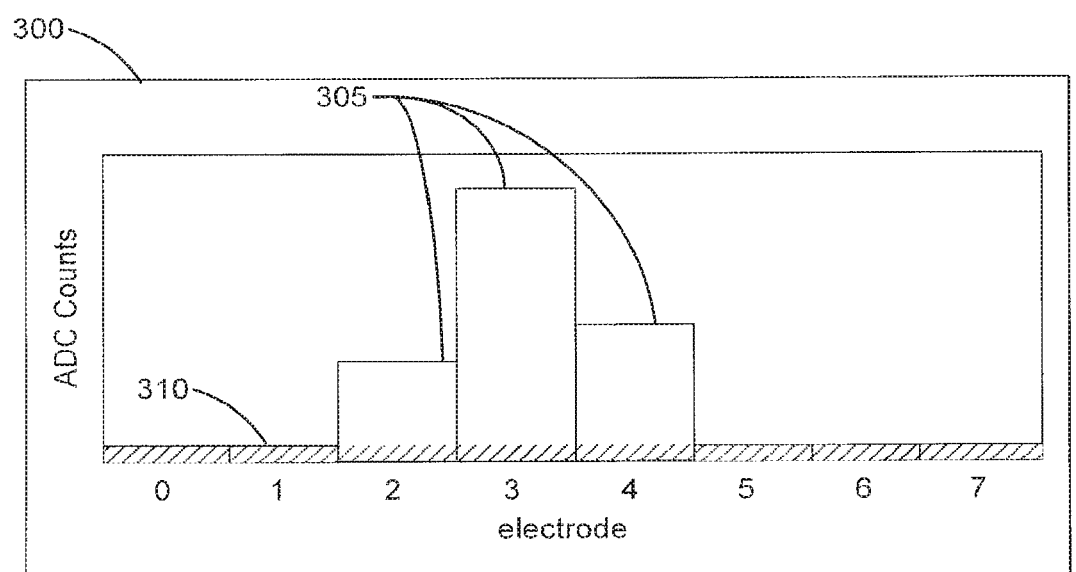
FIG. 3 is an exemplary chart that illustrates analog-to-digital (ADC) measurements associated with electrodes arranged on a contact layer of the touch sensitive device.

FIG. 3 is an exemplary chart 300 that illustrates ADC measurements associated with the electrodes 105 arranged on the contact layer 102. The electrodes 105 are represented along the X-axis of the chart 300. For example, electrode 0 represents the left-most electrode of the contact layer 102. Electrode 7 represents the right-most electrode of the contact layer 102. The Y-axis represents the magnitude of the ADC measurements taken for a given electrode 105. The measurements may correspond to ADC readings associated with the capacitance of a given electrode 105.

In the exemplary chart, capacitance associated with electrodes 0, 1, and 5-7 is at or near a baseline capacitance value 310. The baseline capacitance value 310 is measured when no object is in the vicinity of a respective electrode. The baseline capacitance value 310 measured in this instance indicates that no object is in the vicinity of electrodes 0, 1, and 5-7. Different electrodes may have the same or different baseline in specific embodiments. The baseline may be calibrated or preprogrammed. The baseline may be associated with a range of values below a given level. In the discussion that follows, it is assumed that the baseline values have already been removed.

Contact capacitance values 305, which are capacitance values greater than the baseline capacitance values 310, are measured from electrodes 2-4. The higher capacitance values measured at electrodes 2-4 indicate that an object, such as a user's finger, is in contact with the contact layer 102 in the vicinity of electrodes 2-4. The user's finger, being conductive, contributes to the capacitance at the electrodes even when there is no deflection or distance change caused between the electrodes 2-4 and the ground plane 130. In this instance, electrode 3 has the highest reading followed by electrode 4 and then electrode 2. The relative magnitudes of the readings indicate that the user's finger is somewhere in between electrodes 3 and 4. Had the measurements at electrodes 2 and 4 been the same, then the user's finger would have been directly over electrode 3. The processor 202 analyzes the various contact capacitance values 305 to determine the point at which the user contacts the contact layer 102.

The measurements shown in the exemplary chart 300 are somewhat ideal in that the contact layer 102 is considered to be a rigid material that does not exhibit mechanical deflection when pressed by the user. Single layer capacitive touch devices, in particular, tend to be more susceptible to diffuse or undesired signals measured over a large number of electrodes, such as those background signals associated with background objects, which is discussed in concurrently filed U.S. patent application Ser. No. 13/013,613, which is hereby incorporated by reference, and/or mechanical deflection. For example, referring to FIG. 1C, a background signal associated with mechanical deflection measured at a given electrode may be small when compared to a signal associated with a contact. However, given the number and density of electrodes, the background signal may be measured over a relatively large number of electrodes. When these measurements are considered together, the magnitude of the overall background signal may be similar to that of a contact signal.

Given the size and weight constraints of modern devices that utilize touch sensitive displays, it may not be possible to utilize a material sufficiently rigid to prevent mechanical deflection. Instead, thinner materials, which may exhibit different degrees of mechanical deflection, may be utilized. When mechanical deflection of the contact layer 102 occurs, the assumptions above with respect to the contact location may need to be adjusted depending on the amount of deflection, because the change in distance between the electrodes and the ground plane causes inaccuracy of the capacitance measurements. Multi-layer devices also may not be ideal.

Figure 4:
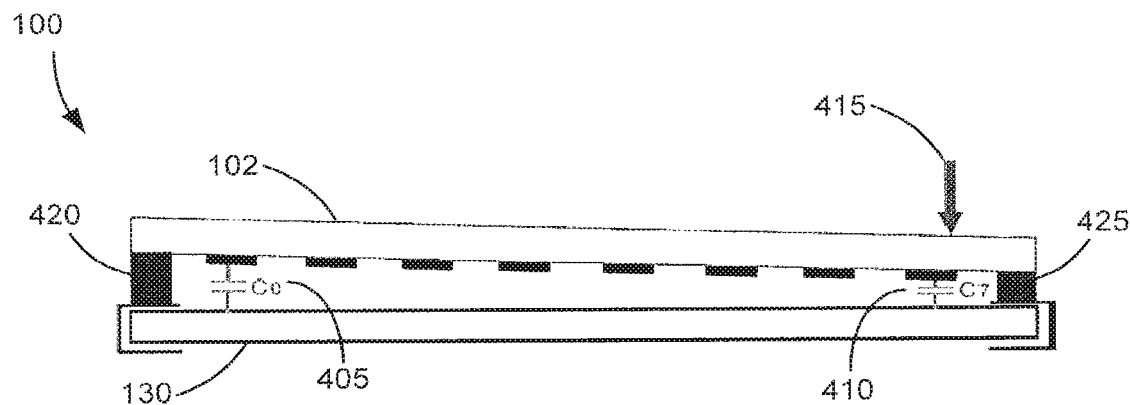
FIG. 4 illustrates a first form of mechanical deflection that may occur when a contact layer of the touch sensitive device is pressed.

FIG. 4 illustrates a linear form of mechanical deflection that may occur when the contact layer 102 is pressed. In this form of mechanical deflection, the support structures 420 and 425 may deform depending on the location of contact 415, while layer 102 may be rigid. For example, a right-most support structure 425 may compress when the right side of the contact layer 102 is pressed. When this occurs, the capacitance values measured at the various electrodes may vary approximately linearly across the contact layer. For example, the change in capacitance 410 of the right-most electrode may be greater than the change in capacitance 405 of the left-most electrode because the change in the air-gap distance between the contact layer 102 and the ground plane 130 on the right side of the touch sensitive device 100 is smaller than the change in the distance between the contact layer 102 and the ground plane 130 on the left side of the touch sensitive device 100. The change in capacitance due to mechanical deflection may be expressed in matrix form as:

$$\begin{bmatrix} \Delta C_0 \\ \Delta C_1 \\ \Delta C_2 \\ \Delta C_3 \\ \Delta C_4 \\ \Delta C_5 \\ \Delta C_6 \\ \Delta C_7 \end{bmatrix} = \frac{1}{7} \begin{bmatrix} 7 & 0 \\ 6 & 1 \\ 5 & 2 \\ 4 & 3 \\ 3 & 4 \\ 2 & 5 \\ 1 & 6 \\ 0 & 7 \end{bmatrix} \begin{bmatrix} m_0 \\ m_7 \end{bmatrix} \text{ or } \Delta C_i = \frac{1}{7}[(7-i)m_0 + im_7]$$

where $i = 0, \ldots, 7$.

where $\Delta C_i$ is the change in the capacitance measured by electrode i due to mechanical deflection, and $m_0$ and $m_7$ are the capacitance changes measured at electrodes 0 and 7, which are assumed to have no capacitance component due to user contact. As noted above, the number of electrodes may be increased or decreased depending on the circumstances. The equation above may be modified accordingly. Other functions may be used, such as using an average, line fitting, or curve fitting for estimating the likely deflection capacitance at the contact layer electrodes based on measurements at other electrodes.

Figure 5:
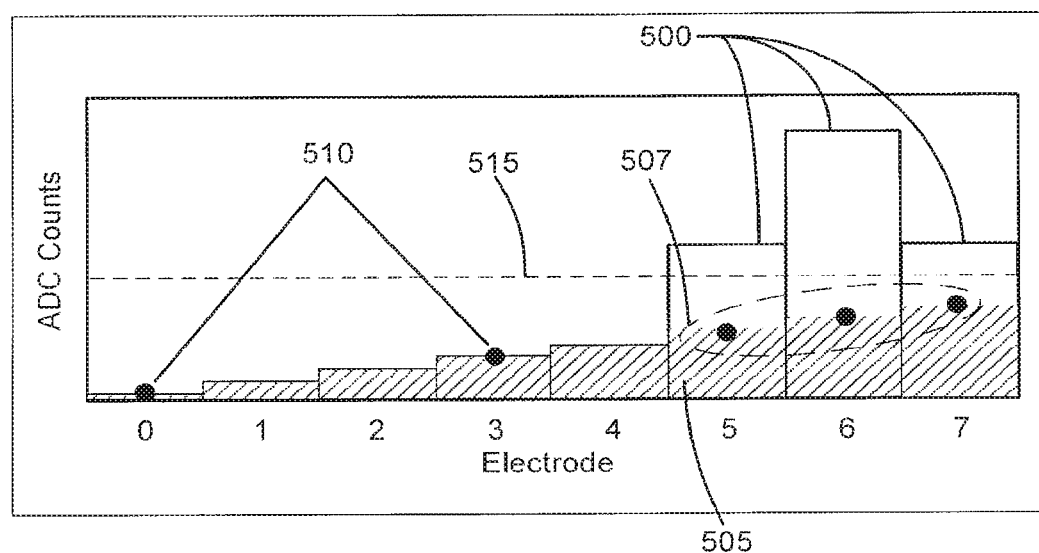
FIG. 5 illustrates example electrode measurements that may be processed when contact occurs on a right side of the contact layer.

FIG. 5 illustrates electrode measurements that may be processed when the contact 415 occurs on the right side of the contact layer 102 and where the above-described mechanical deflection occurs. As described, contact capacitance values 500 may be measured from those electrodes in the vicinity of the contact 415. However, capacitance values associated with mechanical deflection 510 may be measured at the other electrodes. The hashed portion represents the mechanical deflection capacitance values 505 associated with each electrode. For electrodes 0-4, the mechanical deflection capacitance value 505 corresponds to the value measured 510. However, the contact capacitance values 500 measured for electrodes 5-7 include a component 507 that corresponds to the mechanical deflection capacitance value 505. As described earlier, the relative magnitudes of the contact capacitance values 500 are utilized to determine the point of contact. However, the mechanical deflection capacitance values 505 skew the measurements, making it difficult to determine the true point of contact.

Figure 6:
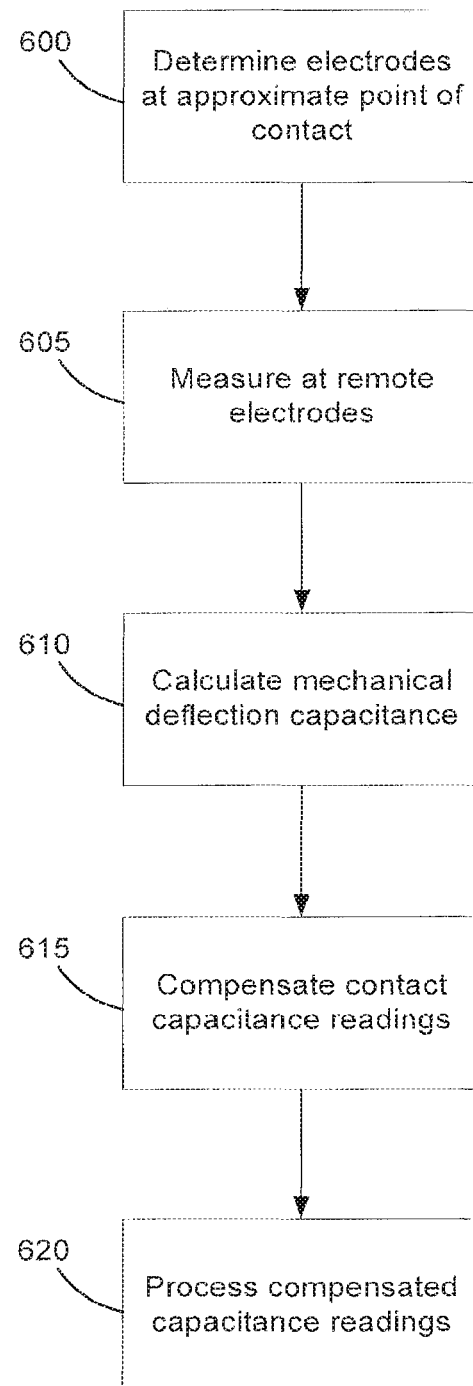
FIG. 6 illustrates exemplary operations that may be utilized to compensate contact capacitance values for the effects of mechanical deflection.

FIG. 6 illustrates exemplary operations that may be utilized to determine the mechanical deflection component of the contact capacitance values, and thereby compensate the contact capacitance values for mechanical deflection of the contact layer 102. Instructions for implementing the operations below with the processor 202 may be stored in a computer-readable-medium, such as the memory 215 described above. Alternatively, hardware or both hardware and software are used to implement the operations. Additional, different, or fewer acts may be provided.

At block 600, the approximate location of contact may be determined. For example, signal amounts or values associated with all or a sub-set of the electrodes are analyzed to determine whether the signal amounts/values exceed a threshold 515 (FIG. 5). Electrodes associated with those values are then presumed to be in the vicinity of the contact. The capacitance measurements taken by those electrodes correspond to the contact capacitance.

At block 605, values at one or more electrodes 510 (FIG. 5) that are remote from the contact location are measured. For example, if electrodes 5-6 are determined to be near the point of contact, values at one or more of electrodes 0-4 may be measured. In some implementations, values at two electrodes 510 (e.g., electrodes 0 and 3 in the example of FIG. 5) not affected directly by the contact may be measured. The electrodes are presumed or selected to be far enough from the point of contact so that the contact itself rather than the deflection will not have a significant influence on the capacitance measured at these electrodes.

At block 610, the measurements associated with the remote electrodes 510 are processed according to the formula above or another formula to find the mechanical deflection capacitance values associated with all the electrodes. For example, the components 507 of the mechanical deflection capacitance values 505 that are part of the contact capacitance values 500 are determined or estimated.

At block 615, the contact capacitance values 500 (i.e., signal amounts measured from the electrodes at the location of contact) are adjusted to account for at least part of the deflection capacitance. The determined components 507 are subtracted from the measured contact capacitance values 500. Different amounts of subtraction may be provided for different electrodes. Even where the estimates are not exact, the correction may provide more accurate measurements.

At block 620, the compensated measurements are processed. The compensated measurements are then used to estimate the actual point or points of contact.

Figure 7:
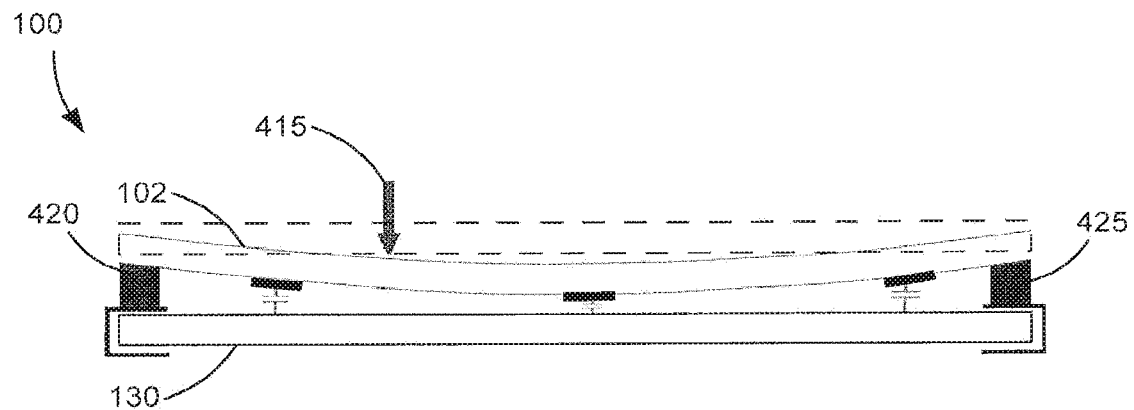
FIG. 7 illustrates another form of mechanical deflection that may occur in a contact layer of a touch sensitive device.

FIG. 7 illustrates another form of mechanical deflection that may occur in a contact layer 102 of a touch sensitive device 100 when a touch 415 is made. In this case, the contact layer 102, rather than the support structures 420 and 425, may deform. It may be shown that the mechanical deflection in the contact layer 102 approximates a symmetric parabolic arc between the two support structures 420 and 425. The resulting parabolic variation in background capacitance can be modeled by the following formula:

$$\Delta C_i = 4 S_x \frac{(2i+1)(2N-2i-1)}{(2N)^2},$$

where $S_x$ is a parameter proportional to the sagitta of the bend and N corresponds to the number of electrodes (in this case 8). Different structures may have different variations. Other formulas may be used to model the deflection of a given structure or structures. This form of mechanical deflection may approximate the parabolic arc regardless of the actual load location between structures 420 and 425, within about a 20% error range. Thus touch 415, shown toward the left portion of layer 102 may have a similar effect as for a touch located at the center of layer 102 between structures 420 and 425.

Figure 8:
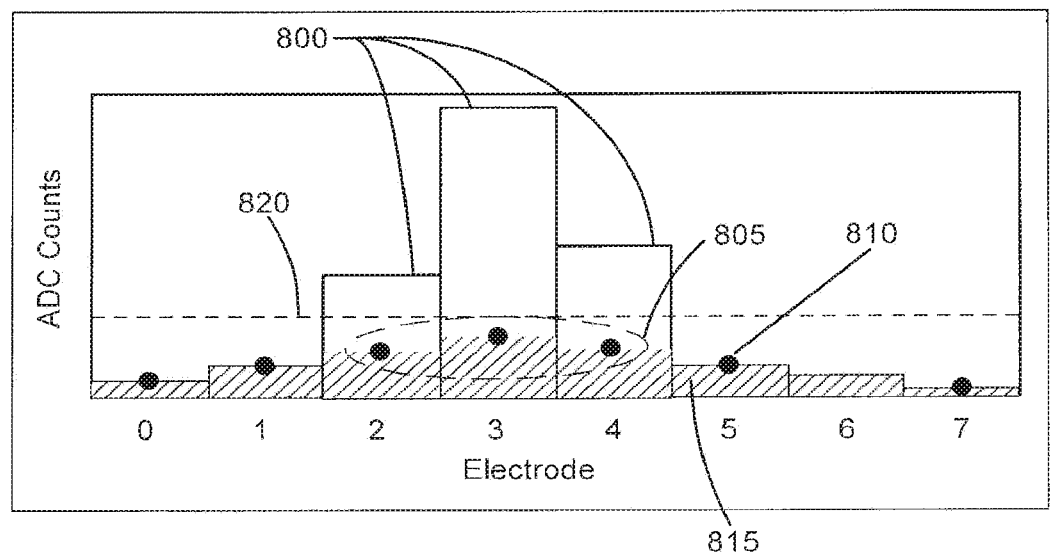
FIG. 8 illustrates example electrode measurements that may be processed when contact occurs in the middle of the contact layer.

FIG. 8 illustrates electrode measurements that may be processed when the contact 415 occurs near the middle of the contact layer 102. As described above, contact capacitance values 800 may be measured from those electrodes in the vicinity of the contact 415. However, mechanical deflection capacitance values 810 may be measured at the other electrodes. The hashed portion 815 represents the amount of mechanical deflection capacitance present at each electrode. As described earlier, the relative magnitudes of the contact capacitance values 800 are utilized to determine the approximate point of contact. The components 805 of the contact capacitance values due to mechanical deflection may, therefore, be computed according to the parabolic or other formula above and utilized to compensate the contact capacitance values 800. For example, to determine $S_x$, the contact region 420 of the contact layer 102 is first determined. The contact region 415 may be determined by identifying electrodes with capacitance measurements greater than a threshold 820.

Next, having identified contact region 415, electrodes are identified that are sufficiently remote from the contact region 415 so as to have small or zero signal from contact capacitance values 800. In some implementations, the most central electrode away from the contact region 415 may result in the best deflection measurement. For example, assuming the contact occurs in the vicinity of electrodes 2, 3, and 4 (values 800), electrode or channel 5 (value 810) may be considered as the most central electrode. Applying the above equation of $\Delta C_i$ to electrode or channel 5 (value 800), the parameter $S_x$ is determined to be:

$$S_x = \frac{\Delta C_5}{4} \frac{(2 \times 8)^2}{(2 \times 5 + 1)(2 \times 8 - 2 \times 5 - 1)} = \frac{\Delta C_5}{4} \frac{16^2}{55}.$$

The value of $S_x$ is determined from a measurement of $\Delta C_i$ for at least one electrode remote from the touch contact, and in some embodiments more than one electrode may be used, such as two adjacent electrodes or the two most central electrodes on different sides of the contact, allowing for non-uniform deflection. After $S_x$ is determined, the components 805 of the contact capacitance values due to mechanical deflection capacitance may be subtracted from the measured contact capacitance values 800.

The principle of the previous two examples can be generalized. In some cases, it might be sufficient to model the air gap distance between the contact layer 102 and the ground plane 130 as a function of position using:

$$D(x,y) = D_0 - \delta - \tau_x \cdot x - \tau_y \cdot y - \sigma_x(1-x^2) - \sigma_y(1-y^2)$$

where $D_0$ is initial distance of the air gap without deflection, $\delta$ is the spatially averaged rigid body deflection, $\tau_x$ and $\tau_y$ are the rigid body tilts in the x and y directions, and $\sigma_x$ and $\sigma_y$ are sagittas of flexing curvature in the x and y directions. Here, x and y are scaled to range from −1 to 1 over the contact area. The air gap between the electrode and the ground plane 130 may be important because it influences the touch signal capacitance calculated. If the air gap distance is $D(x,y)$, the capacitance for an electrode i is then $$C_i = \int_{A_i} \frac{\varepsilon}{D(x,y)} dxdy$$

where the integral is over the electrode area A. The change in capacitance $\Delta C_i$ for each electrode i is:

$$\Delta C_i = \int_{A_i} \varepsilon \left( \frac{1}{D(x,y)} - \frac{1}{D_0} \right) dxdy = \Delta C_i(\delta, \tau_x, \tau_y, \sigma_x, \sigma_y).$$

Five measurements $m_A$, $m_B$, $m_C$, $m_D$, $m_E$ may be needed to solve for the five unknown parameters $\delta$, $\tau_x$, $\tau_y$, $\sigma_x$, $\sigma_y$. Accordingly, $\Delta C_i$ may be linearized to $$\begin{bmatrix} \Delta C_0 \\ \vdots \\ \Delta C_N \end{bmatrix} = [M_1] \begin{bmatrix} \delta \\ \tau_x \\ \tau_y \\ \sigma_x \\ \sigma_y \end{bmatrix} \text{ and } \begin{bmatrix} \delta \\ \tau_x \\ \tau_y \\ \sigma_x \\ \sigma_y \end{bmatrix} = [M_2] \begin{bmatrix} m_A \\ m_B \\ m_C \\ m_D \\ m_E \end{bmatrix}$$

With the matrix $M = M_1 M_2$ the following equation may be utilized.

$$\begin{bmatrix} \Delta C_0 \\ \vdots \\ \Delta C_N \end{bmatrix} = [M] \begin{bmatrix} m_A \\ m_B \\ m_C \\ m_D \\ m_E \end{bmatrix}$$

Referring again to the operations in FIG. 6, at block 605 measurements of $m_A$, $m_B$, $m_C$, $m_D$, and $m_E$ may be made. As in the two examples given above, these measurements might be based on signals from electrodes used to detect contact with the contact layer 102.

Figure 9A:
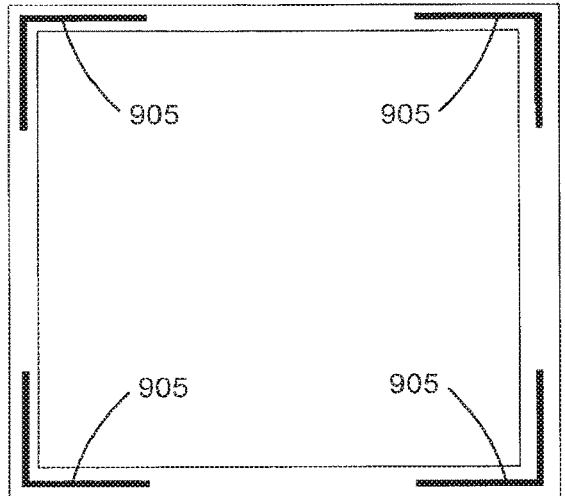
FIGS. 9a-9d illustrate examples of added electrodes for the purpose of monitoring mechanical deflection.
Figure 9B:
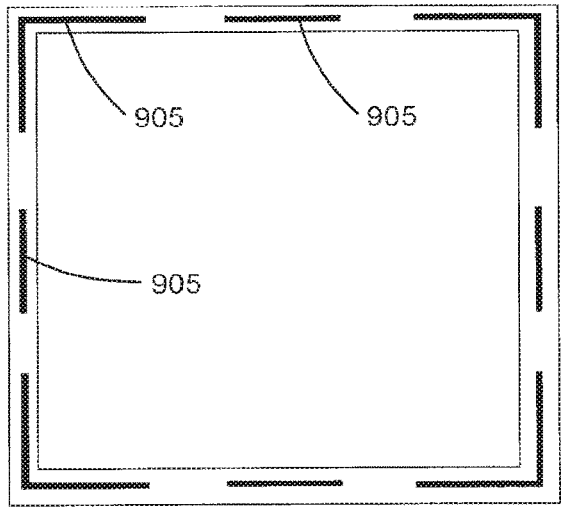
Figure 9C:
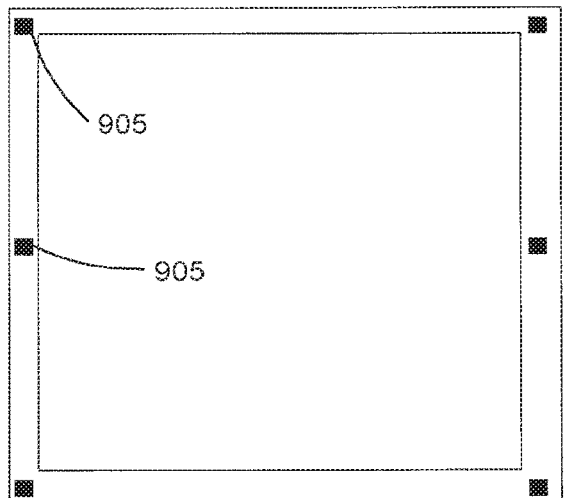
Figure 9D:
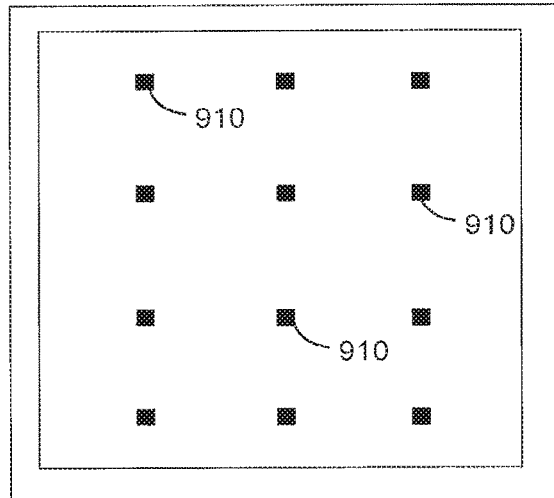

While various embodiments have been described, it will be apparent to those of ordinary skill in the art that many more embodiments and implementations may be possible that are within the scope of the claims. For example, referring to FIG. 9a, the one or more of $m_A$, $m_B$, $m_C$, $m_D$, and $m_E$, described above may correspond to electrodes specifically added for the purpose of measuring deflection rather than using the existing touch coordinate sensing electrodes. The arrangement of the electrodes may vary. For example, referring to FIGS. 9a through 9c, the conductive electrodes 905, such as elongate or pad-shaped electrodes, may be positioned around the periphery of the panel away from the viewing portion of the contact layer at corners and/or sides. Alternatively, the electrodes 910 which may be transparent conductive material may be arranged in the viewing area according to a specific embodiment, as illustrated in FIG. 9d.

In some implementations one or more strain gauges or different strain measuring devices may be utilized to measure mechanical deflection. For example, electrodes may be utilized to determine a contact location. Then the one or more strain gauges may be utilized to measure the mechanical deflection. The mechanical deflection measurements may then be utilized to compensate the electrode measurements described above.

Any model, such as accounting for two or more types of deflection at a same time, may be used. The choice of electrodes spaced away from the contact may be based on the likely types of deflection involved or may be sampled randomly or in a pattern in order to account for different types of deflection. The values at all electrodes not above the threshold may be used. The capacitance values may be low pass filtered over space and/or time to reduce the effects of noise.

Accordingly, it will be apparent to those of ordinary skill in the art that many more embodiments and implementations are possible that are within the scope of the claims. Therefore, the embodiments described are only provided to aid in understanding the claims and do not necessarily limit the scope of the claims.

What is claimed is:

1. A method for monitoring mechanical deflection of a contact layer of a touch sensitive device, the method comprising:
   measuring output signals associated with a plurality of electrodes of the touch sensitive device generated in response to contact on the contact layer;
   identifying at least a first electrode, from the plurality of electrodes, positioned at an approximate location of contact on the contact layer;
   selecting an output signal from the measured output signals, wherein the output signal is associated with at least one other electrode that is separated from the first electrode by a distance, and wherein the output signal corresponds to a deflection capacitance; and
   determining a mechanical deflection of the contact layer caused by the contact, based on the deflection capacitance.

2. The method according to claim 1, wherein the identifying at least a first electrode comprises determining which electrode of the plurality of electrodes includes a capacitance greater than a given threshold.

3. The method according to claim 1, wherein each of the measured output signals includes a deflection capacitance component between a given electrode and a ground plane that is common to each of the plurality of electrodes.

4. The method according to claim 1, wherein the deflection capacitance is determined as follows:

$$\Delta C_i = \frac{1}{N}[(N-i)m_o + im_N]$$

where $\Delta C_i$, is the capacitance associated with mechanical deflection of an $i_{th}$ electrode, N+1 is a number of electrodes, i=0, ..., N, and $m_o$ and $m_N$ correspond to deflection capacitance components of a first and an Nth electrode, respectively.

5. The method according to claim 1, wherein the deflection capacitance is determined as follows:

$$\Delta C_i = 4S_x \frac{(2i+1)(2N-2i-1)}{(2N)^2}$$

where $\Delta C_i$, is the capacitance associated with mechanical deflection of an $i_{th}$ electrode, N is a number of electrodes, i=0, ..., N−1, where the value of $S_x$, is determined from a measurement of $\Delta C_i$, for at least one electrode remote from the location of the contact.

6. The method according to claim 1, wherein the contact layer comprises a transparent surface and the plurality of electrodes are arranged on the transparent surface, and the transparent surface is positioned over a display surface.

7. The method according to claim 1, wherein the plurality of electrodes terminate along a peripheral edge of the touch sensitive device.

8. The method according to claim 1, wherein the distance corresponds to a distance between two or more electrodes.

9. A system for monitoring mechanical deflection of a contact layer on a touch sensitive device, the system comprising:
   one or more analog-to-digital converters configured to measure output signals associated with a plurality of electrodes, wherein the output signals occur in response to contact on the contact layer, and the plurality of electrodes include a first electrode and at least one other electrode that is separated from the first electrode by a distance; and
   a processor configured to:
      identify a relative location of the first electrode in response to contact being made with the contact layer approximately at the first electrode;
      select an output signal from the measured output signals, wherein the output signal is associated with the at least one other electrode, and wherein the output signal corresponds to a deflection capacitance; and
      determine a mechanical deflection of the contact layer caused by the contact, based on the deflection capacitance.

10. The system according to claim 9, wherein the processor is further configured to identify the relative location of the first electrode by determining which electrode of the plurality of electrodes includes a capacitance greater than a given threshold.

11. The system according to claim 9, wherein each of the measured output signals includes a deflection capacitance component between a given electrode and a ground plane that is common to each of the plurality of electrodes.

12. The system according to claim 9, wherein the processor is further configured to determine the deflection capacitance as follows:

$$\Delta C_i = \frac{1}{N}[(N-i)m_o + im_N]$$

where $\Delta C_i$, is the capacitance associated with mechanical deflection of an $i_{th}$ electrode, N+1 is a number of electrodes, i=0, ..., N, and $m_o$ and $m_N$ correspond to deflection capacitance components of a first and an Nth electrode, respectively.

13. The system according to claim 9, wherein the processor is further configured to determine the deflection capacitance as follows:

$$\Delta C_i = 4S_x \frac{(2i+1)(2N-2i-1)}{(2N)^2}$$

where $\Delta C_i$, is the capacitance associated with mechanical deflection of an $i_{th}$ electrode, N is a number of electrodes, i=0, ..., N−1, where the value of $S_x$ is determined from a measurement of $\Delta C_i$, for at least one electrode remote from the location of the contact.

14. The system according to claim 9, wherein the contact layer comprises a transparent surface and the plurality of electrodes are arranged on the transparent surface, and the transparent surface is positioned over a display surface.

15. The system according to claim 9, wherein the plurality of electrodes terminate along a peripheral edge of the touch sensitive device.

16. The system according to claim 9, wherein the distance corresponds to a distance between two or more electrodes.

17. A non-transitory computer readable storage medium having stored therein data representing instructions executable by a programmed processor for monitoring mechanical deflection of a contact layer on a touch sensitive device, the instructions comprising:
- measuring output signals associated with a plurality of electrodes of the touch sensitive device generated in response to contact on the contact layer;
- identifying at least a first electrode, from the plurality of electrodes, positioned at an approximate location of contact on the contact layer;
- selecting an output signal from the measured output signals, wherein the output signal is associated with at least one other electrode that is separated from the first electrode by a distance, and wherein the output signal corresponds to a deflection capacitance;
- determining a mechanical deflection of the contact layer caused by the contact, based on the deflection capacitance.

18. The non-transitory computer readable storage medium of claim 17, wherein the deflection capacitance is determined as follows:

$$\Delta C_i = 4 S_x \frac{(2i+1)(2N-2i-1)}{(2N)^2}$$

where $\Delta C_i$, is the capacitance associated with mechanical deflection of an $i_{th}$, electrode, N is a number of electrodes, i=0, ..., N−1, and where the value of $S_x$ is determined from a measurement of $\Delta C_i$, for at least one electrode remote from the first electrode.

19. The non-transitory computer readable storage medium of claim 17, wherein the deflection capacitance is determined as follows:

$$\Delta C_i = \frac{1}{N}[(N-i)m_o + i m_N]$$

where $\Delta C_i$, is the capacitance associated with mechanical deflection of an $i_{th}$, electrode, N+1 is a number of electrodes, i=0, ..., N, and $m_o$ and $m_N$ correspond to capacitance measurements of a first and an Nth electrode, respectively.

20. The non-transitory computer readable storage medium of claim 17, wherein the contact layer comprises a transparent surface and the plurality of electrodes are arranged on the transparent surface, and the transparent surface is positioned over a display surface.

* * * * *

UNITED STATES PATENT AND TRADEMARK OFFICE
CERTIFICATE OF CORRECTION

PATENT NO. : 10,691,269 B2
APPLICATION NO. : 15/976336
DATED : June 23, 2020
INVENTOR(S) : Kent et al.

Page 1 of 1

It is certified that error appears in the above-identified patent and that said Letters Patent is hereby corrected as shown below:

On the Title Page

Item (56), replace "WO 96/15464" with --WO 96/15464 A1--.

In the Claims

In Column 11, Line 41, replace "where $\Delta C_i$," with --where $\Delta C_i$--.

In Column 11, Line 54, replace "where $\Delta C_i$," with --where $\Delta C_i$--.

In Column 11, Lines 56-57, replace "where the value of $S_x$, is determined from a measurement of $\Delta C_i$, for" with --where the value of $S_x$ is determined from a measurement of $\Delta C_i$ for--.

In Column 12, Line 40, replace "where $\Delta C_i$," with --where $\Delta C_i$--.

In Column 12, Line 54, replace "where $\Delta C_i$," with --where $\Delta C_i$--.

In Column 12, Line 57, replace "measurement of $\Delta C_i$, for" with --measurement of $\Delta C_i$ for--.

In Column 14, Line 1, replace "where $\Delta C_i$," with --where $\Delta C_i$--.

In Column 14, Line 4, replace "measurement of $\Delta C_i$, for" with --measurement of $\Delta C_i$ for--.

In Column 14, Lines 15-16, replace "where $\Delta C_i$, is the capacitance associated with mechanical deflection of an $i_{th}$, electrode" with --where $\Delta C_i$ is the capacitance associated with mechanical deflection of an $i_{th}$ electrode--.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*